United States Patent [19]

Seko et al.

[11] Patent Number: 5,425,041
[45] Date of Patent: Jun. 13, 1995

[54] MULTIQUANTUM BARRIER LASER HAVING HIGH ELECTRON AND HOLE REFLECTIVITY OF LAYERS

[75] Inventors: Yasuji Seko; Kiichi Ueyanagi, both of Kanagawa; Yasuhiro Shiraki, Tokyo, all of Japan

[73] Assignees: Fuji Xerox Co., Ltd.; Yashuhiro Shiraki, both of Tokyo, Japan

[21] Appl. No.: 214,235

[22] Filed: Mar. 17, 1994

[30] Foreign Application Priority Data

Mar. 18, 1993 [JP] Japan ................................. 5-59085
Jun. 28, 1993 [JP] Japan ................................. 5-157740

[51] Int. Cl.⁶ .............................................. H01S 3/19
[52] U.S. Cl. ..................................................... 372/45
[58] Field of Search .................................... 372/45, 46

[56] References Cited

U.S. PATENT DOCUMENTS 5,319,660  6/1994  Chen et al. ............................ 372/45

FOREIGN PATENT DOCUMENTS 63-46788  2/1988  Japan .
4-114486  4/1992  Japan .

OTHER PUBLICATIONS

"Electronics Letters", 11th Sep. 1986, vol. 22, No. 19, pp. 1008-1009.
"Japanese Journal of Applied Physics", vol. 29, No. 11, 11-90, p. L1977-1980.
IEEE Journal of Quantum Electronics, vol. 28, No. 10, Oct. 10, 1992 pp. 1977-1982.
Arimoto et al., "Experimental Verification Concerning MQB Effect of AlGaInP visible radiation laser".
Takagi et al., "Design of Multiquantum Barrier (MQB) and Experimental Verification of Reflecting Effect of Electronic Waves" Dec. 1991.

*Primary Examiner*—James W. Davie
*Attorney, Agent, or Firm*—Finnegan, Henderson Farabow, Garrett & Dunner

[57] ABSTRACT

It is an object of the present invention to provide a highly efficient semiconductor laser unit having excellent temperature characteristics, in which electrons or holes are suppressed from overflowing from the active layer to the cladding layers while the threshold of current density is maintained low. The present invention is to provide a semiconductor laser unit fundamentally composed of an active layer and cladding layers in which the active layer is interposed between the cladding layers the semiconductor laser unit comprising: a multiquantum barrier layer including well layers and barrier layers disposed between the active layer and the cladding layers or disposed in the cladding layers close to the active layer, wherein the well and barrier layers have a high reflectivity with respect to the electrons and holes at a position close to $\Gamma$-point in the reciprocal lattice space, and also the well and barrier layers have a high reflectivity with respect to the electrons and holes at a position close to at least one of the primary symmetrical points.

27 Claims, 9 Drawing Sheets

MULTIQUANTUM BARRIER LASER HAVING HIGH ELECTRON AND HOLE REFLECTIVITY OF LAYERS

BACKGROUND OF THE INVENTION

The present invention relates to a highly efficient semiconductor laser unit having appropriate temperature characteristics used for the light source of a laser printer or bar code reader.

The semiconductor laser unit is fundamentally composed of an active layer and cladding layers, in which the active layer is interposed between the cladding layers. Various semiconductor materials are used for the semiconductor laser unit. For example, a red semiconductor laser for oscillating a beam of light of short wavelength is usually composed of AlGaInP material. In this case, a beam of light of short wavelength is defined as a beam of light of which the wavelength is shorter than the wavelength of an infrared ray which is in the oscillating band of a common semiconductor laser.

However, in the case of this AlGaInP material, it is not possible to provide a large band gap between the cladding and active layers. Therefore, a problems is caused in which carriers, especially electrons, overflow from the active layer to the cladding layers so that the laser characteristics are deteriorated. That is, the luminous efficiency of the laser is low due to the overflow of carriers, and further the temperature characteristics are deteriorated.

As a means for solving the above problems, a multiquantum barrier structure has been proposed. The multiquantum barrier structure is a superlattice in which well layers and barrier layers are alternately laminated. Due to the changes in potential and effective mass, the multiquantum barrier structure is capable of reflecting electrons of high energy compared with the barrier layer composing the multiquantum barrier structure. When the multiquantum barrier layer is provided between the active and cladding layers or in the cladding layers close to the active layer, the electrons in the active layer can be prevented from overflowing, so that the laser characteristics such as temperature characteristics and luminous efficiency can be improved, which is disclosed and published in the following documents:

Official gazette of Japanese Unexamined Patent Publication No. 4-114486; "Design of multiquantum barrier (MQB) and experimental verification of reflecting effect of electronic waves" by Takagi and et al. on page 527 to 535 of Vol. J74-C-I of theses of C-I of Electronic Information Communication Society published in December of 1991; "Experimental verification concerning MQB effect of AlGaInP visible radiation laser" by Arimoto et al. disclosed in 19a-V-5 in the fifty third lecture meeting of the Applied Physics Society held in autumn of 1992; and "Superposed Multiquantum Barriers for InGaAlP Hetero-junctions" by Furuya et disclosed in IEEE JOURNAL OF QUANTUM ELECTRONICS, VOL. 28, NO 10, OCT. 1992, pp 1977–1982.

However, in the case of the multiquantum barrier structure of the prior art, consideration is given only to the reflection of electrons which occurs at a position close to point Γ which is one of the symmetrical points in the reciprocal lattice space, and consideration is not given to the reflection of electrons which occurs at a position close to point X or L which is another primary symmetrical point. In this connection, the reciprocal lattice space is a space for expressing a crystal structure, and the substantial lattice of the crystal structure and the reciprocal lattice in the reciprocal lattice space can be converted to each other in accordance with a predetermined converting expression. When the actions of electrons in the crystal and those of holes are described using this reciprocal lattice space, it becomes easy to treat them physically. In the case where various lattices are three-dimensionally expressed using this reciprocal lattice space, symmetrical points are referred to as Γ, L and X points.

In the conventional multiquantum barrier structure described above, electrons at a position close to Γ point are effectively reflected, so that they are prevented from overflowing to the cladding layers, however, electrons at a position close to X or L point are not reflected, so that they overflow. Consequently, electrons having high energy move to X or L point, the energy level of which is low, and they overflow to the cladding layers.

In FIG. 10, is shown a band structure of points Γ and X of the multiquantum barrier proposed in the above mentioned "Design of multiquantum barrier (MQB) and experimental verification of reflecting effect of electronic waves" by Takagi and et al. on page 527 to 535 of Vol. J74-C-I of theses of C-I of Electronic Information Communication Society published in December of 1991. In this structure, the cladding layers 51 and the barrier layer 53 of the multiquantum barrier 52 are composed of the composition of $(Al_{0.7}Ga_{0.3})InP$, so that the energy level of point Γ and that of point X are permitted to be approximately the same. In this case, the well layer 54 is composed of GaInP. In this connection, numeral 55 is an active layer of GaInP.

In FIG. 1, an example of the reflectivity of electrons is shown when the electrons are reflected on the multiquantum barrier having the band structure of Γ point described above. In this case, $U_0$ is 115 meV, the well layer thickness is 6 atomic layers, and the barrier layer thickness is 5 atomic layers. As can be seen in the graph of FIG. 11, when the multiquantum barrier is used, the reflectivity is high even in the case of electrons of relatively high energy, so that the electrons are prevented from overflowing. However, electrons move from a position close to point Γ on the active layer 55 to a position close to point X on the first barrier layer 53a (shown in FIG. 10) of the multiquantum barrier, and the electrons are reflected by the reflectivity shown in FIG. 12. As can be seen from the graph shown in FIG. 12, the reflectivity of electrons at the position close to point X is low in an energy region (in a region close to 120 meV in the example shown in FIG. 12), and electrons in this region pass through the multiquantum barrier 52 and overflow onto the cladding layers 51. As a result, the electrons overflow outside from the active layer 55.

As described above, in the multiquantum barrier structure of the prior art, carriers are not sufficiently suppressed from overflowing, and the most appropriate multiquantum barrier structure can not be provided.

It is an object of the present invention to provide a highly efficient semiconductor laser unit having excellent temperature characteristics, in which electrons or holes are suppressed from overflowing from the active layer to the cladding layers while the threshold of current density is maintained low.

SUMMARY OF THE INVENTION

In order to accomplish the above object, the present invention is to provide a semiconductor laser unit fundamentally composed of an active layer and cladding layers, in which the active layer is interposed between the cladding layers, the semiconductor laser unit comprising: a multiquantum barrier layer including well layers and barrier layers disposed between the active layer and the cladding layers, or disposed in the cladding layers close to the active layer, wherein the well and barrier layers have a high reflectivity with respect to the electrons and holes at a position close to $\Gamma$-point in the reciprocal lattice space, and also the well and barrier layers have a high reflectivity with respect to the electrons and holes at a position close to at least one of the primary symmetrical points.

According to the present invention, in order to suppress the electrons from overflowing from the active layer to the cladding layer, a superlattice (multiquantum barrier layer) is provided between the active layer and the cladding layers, or in the cladding layers close to the active layer, wherein the thickness and composition of the well and barrier layers are set in such a manner that the well and barrier layers have a high reflectivity with respect to the electrons and holes at a position close to $\Gamma$ point in the reciprocal lattice space, and also the well and barrier layers have a high reflectivity with respect to the electrons and holes at a position close to at least one of the primary symmetrical points.

As a primary symmetrical point to be considered except for $\Gamma$ point, a symmetrical point forming a bottom of the conductive band of the cladding layer is taken. In the case where the symmetrical point forming the bottom of the conductive band is coincident with $\Gamma$ point, a symmetrical point of which the energy level is low next to $\Gamma$ point is taken. Usually, the multiquantum barrier structure may be designed giving consideration to these two symmetrical points so that the reflectivity of electrons can be improved. However, other symmetrical points may be also considered.

For the purpose of suppressing the overflow of electrons, the multiquantum barrier is usually provided on the side of a p-type cladding layer, however, it may be provided on both sides of p-type and n-type cladding layers while consideration is given to the symmetry of the laser structure.

In order to suppress the overflow of electrons, the multiquantum barrier may be composed of distorted crystals. In the case of an AlGaInP system laser, the multiquantum barrier is composed of $Ga_{0.4}In_{0.6}P$ well layer (compression distortion) and $Al_{0.6}In_{0.4}P$ barrier layer (tensile distortion), and a more effective multiquantum barrier can be formed.

The guiding principle of designing the multiquantum barrier structure for suppressing the overflow of holes is essentially the same as that of designing the multiquantum barrier structure for suppressing the overflow of electrons. In this case, since the holes exist in the valence band, the primary symmetrical point to be considered except for $\Gamma$ point is a symmetrical point forming a top of the valence band of the cladding layer. In the case where this point is coincident with $\Gamma$ point, the next point of which the energy level is low is taken for the primary symmetrical point.

In this connection, a relation between the composition and energy level is considered in the case of a red semiconductor laser made of AlGaInP material. FIG. 1 is an energy band diagram of $(Al_xGa_{1-x})_{0.5}In_{0.5}P$ material. The horizontal axis shows a composition ratio, and the vertical axis shows values of discontinuity $\Delta Ec$ and $\Delta Ev$ of the conduction band and the valence band. In the red semiconductor laser made of AlGaInP material, in the conduction band in which the problem of overflow of carrier is caused, a combination of materials by which the potential changes $\Delta\Gamma$ and $\Delta X$ of points $\Gamma$ and $X$ can be most increased, is the combination of GaInP and AlInP as can be seen from FIG. 1. As illustrated in FIG. 1, a bottom of the conductive band of AlInP is point X, and its energy level is lower than point $\Gamma$ of $(Al_{0.7}Ga_{0.3})InP$. However, in the reflection of electrons on the multiquantum barrier, the more the change in potential is, the more effect can be provided by the reflection. Therefore, it is advantageous that the change in potential is made to be large. For this reason, the combination of GaInP and AlInP is selected for the well layer and the barrier layer of the multiquantum barrier.

The well layer and barrier layer made of GaInP and AlInP are laminated 10 times to form a multiquantum barrier as illustrated in FIGS. 2(a) and 2(b). The reflectivity of electrons reflected by the formed multiquantum barrier at a position close to point X is shown in FIGS. 2(b) to 2(d), and the reflectivity of electrons at a position close to point $\Gamma$ is shown in FIGS. 3(b) to 3(d). In this case, the effective masses of GaInP and AlInP are respectively $0.11 m_0$ and $0.20 m_0$ ($m_0$ is the mass of an electron), and the energy differences between points $\Gamma$ and X in the conductive bands of GaInP and AlInP are respectively 240 meV and 160 meV. The reflectivity is shown in FIGS. 2(b) to 2(d) and FIGS. 3(b) to 3(d) when the period (Lz+Lb) of the well width (Lz) and barrier width (Lb) is changed on the assumption that the well width (Lz) and barrier width (Lb) are the same. That is, FIGS. 2(b) and 3(b) show a case of Lz=Lb=14.2 Å, FIGS. 2(c) and 3(c) show a case of Lz=Lb=19.8 Å, and FIGS. 2(d) and 3(d) show a case of Lz=Lb=31.1 Å.

From FIGS. 2 and 3, the reflectivity of electrons reflected on the multiquantum barrier composed of one type of well layer and barrier was found out. When these layers are combined, a structure by which electrons are most effectively reflected can be provided. Examples of the multiquantum barrier composed of different types of well and barrier layers are shown in FIGS. 4 and 5.

In FIG. 4, a combination is employed, in which the first, second and third layers A1, A2 and A3 are combined. In this case, the layers A1, A2 and A3 are composed as follows:

In the first layer A1, 10 atomic layers (thickness: 28.3 Å) of GaInP and 10 atomic layers of AlInP form a pair, and 5 periods form one period of the first layer A1. In the same manner, in the second layer A2, 6 atomic layers (thickness: 17 Å) and 6 atomic layers form a pair, and 7 periods form one period of the second layer A2. In the third layer A3, 4 atomic layers (thickness: 11.3 Å) and 4 atomic layers form a pair, and 9 periods form one period of the third layer A3. FIG. 4(a) shows the band structure of $\Gamma$ point. FIG. 4(b) shows the reflectivity of electrons of $\Gamma$ point. FIG. 4(c) shows the reflectivity of electrons of X point. In the structure shown in FIG. 4(a), as illustrated in FIG. 4(b), concerning the electrons in a region close to $\Gamma$ point, the reflectivity is approximately 1 in a range from low energy to 560 meV. As illustrated in FIG. 4(c), concerning the electrons in a region close to X point, the reflectivity is approximately 1 in a range from low energy to 250 meV.

In FIG. 5, a combination is employed, in which the first, second and third layers B1, B2 and B3 are combined. In this case the layers B1, B2 and B3 are composed as follows:

In the first layer B1, 11 atomic layers (thickness: 31.3 Å) of GaInP and 11 atomic layers of AlInP form a pair, and 5 periods form one period of the first layer B1. In the same manner, in the second layer B2, 7 atomic layers (thickness: 19.7 Å) and 7 atomic layers form a pair, and 7 periods form one period of the second layer B2. In the third layer B3, 5 atomic layers (thickness: 14.2 Å) and 5 atomic layers form a pair, and 9 periods form one period of the third layer B3. FIG. 5(a) shows the band structure of Γ point. FIG. 5(b) shows the reflectivity of electrons of Γ point. FIG. 5(c) shows the reflectivity of electrons of X point. In the structure shown in FIG. 5(a), as illustrated in FIG. 5(b), concerning the electrons in a region close to Γ point, the reflectivity is approximately 1 in a range from low energy to 560 meV. As illustrated in FIG. 5(c), concerning the electrons in a region close to X point, the reflectivity is approximately 1 in a range from low energy to 250 meV.

According to the aforementioned multiquantum barrier structure in which different types of well and barrier layers are combined, in both areas close to points Γ and X, the reflectivity can be made to be approximately 1 with respect to the electrons in the region from low to high energy. Therefore, electrons can be effectively suppressed from overflowing from the active layer to the cladding layers.

The thickness and period of the well layer and barrier layer of the multiquantum barrier are not limited to the values described in the above example. That is, a multiquantum barrier structure can be provided, by which the overflow of electrons from the active layer to the cladding layers can be effectively suppressed, when the well layer of GaInP and the barrier layer of AlInP are composed in the following manner:

The thicknesses of the well layer of GaInp and the barrier layer of AlInP are respectively not less than 25 Å to 35 Å, and not less than 3 periods form one period of the layer. The thicknesses of the well layer of GaInp and the barrier layer of AlInP are respectively not less than 15 Å to 25 Å, and not less than 5 periods form one period of the layer. The thicknesses of the well layer of GaInp and the barrier layer of AlInP are respectively not less than 10 Å to 15 Å, and not less than 5 periods form one period of the layer.

In the above example, the well width and the barrier width of the multiquantum barrier are made to be the same, and the width of each layer is successively reduced from the active layer toward the cladding layer. Even if these orders are changed, the same result can be provided. Further, in the above example, the well layer width and the barrier layer width are made to be the same, and they are repeated by several periods. However, the well layer and barrier layer, the widths of which are different, may be laminated so as to form a multiquantum barrier. In the above example, the well width and barrier width of the multiquantum barrier are integral multiples of one atomic layer. Of course, the well width and barrier width may be set at an intermediate value.

In the above example, the well layer of the multiquantum barrier is set at GaInP, and the barrier layer is set at AlInP. However, the well layer may be set as follows.

$$(Al_xGa_{1-x})_yIn_{1-y}P \ (0<x<1, \ 0.3<y<0.7)$$

The barrier layer may be set as follows.

$$(Al_xGa_{1-x})_yIn_{1-y}P \ (0<x<1, \ 0.3<y<0.7)$$

Further, the band gap of the well layer is made to be smaller than that of the barrier layer. In this way, the multiquantum barrier may be formed.

DETAILED DESCRIPTION OF THE PREFERRED EMBODIMENTS

An embodiment of laser structure to which the present invention is applied will be described as follows.

EMBODIMENT 1

Figure 6A:
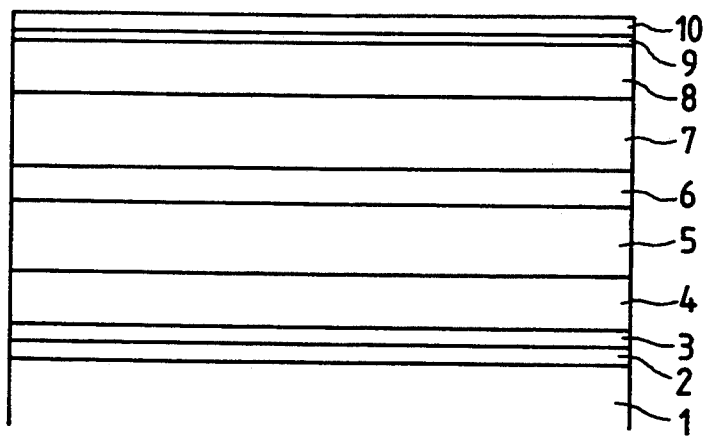
FIGS. 6(a) and 6(b) are sectional views showing a model of the example of the semiconductor laser unit of the present invention.

As illustrated in FIG. 6(a), the following layers are successively laminated on the Si dope n-type GaAs base plate 1:

The Si dope n-type GaAs (referred to as GaAs: Si hereinafter) buffer layer 2, the thickness of which is 0.2 μm; the n-type GaInP: Si buffer layer 3, the thickness of which is 0.2 μm; and n-type $(Al_{0.7}Ga_{0.3})InP$:Si cladding layer 4, the thickness of which is 0.6 μm.

Next, the superlattice cladding layer (Si dope) 5 composed of the GaInP well layer of 8.5 Å thickness and (Al$_{0.7}$Ga$_{0.3}$)InP barrier layer of 8.5 Å thickness is made to grow to the thickness of about 800 Å. Then, a non-dope GaInP layer, which is the active layer 6, is provided on this superlattice cladding layer 5 so that the thickness of the non-dope GaInP layer is made to grow to 400 Å.

Figure 6B:
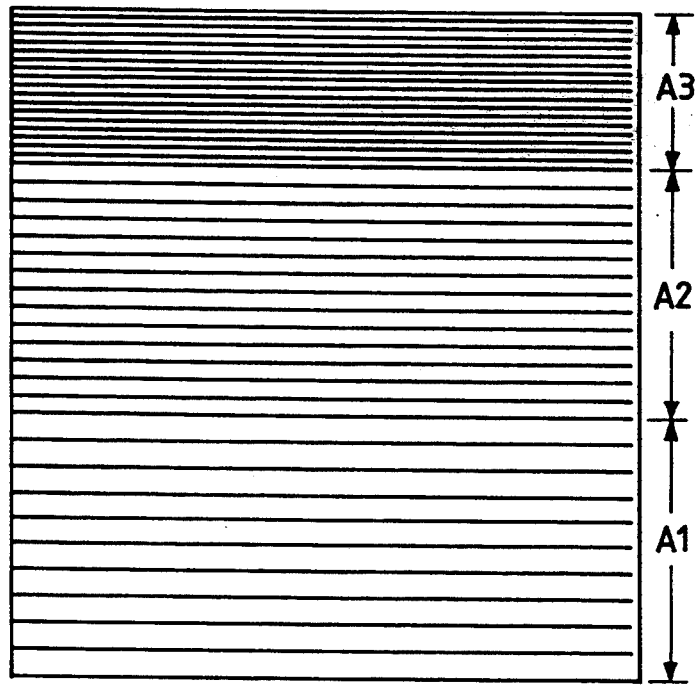

Next, the multiquantum barrier 7 which has been subjected to P-type doping is made to grow to the thickness of about 830 Å. As shown in FIG. 6(b), this multiquantum barrier 7 is composed of the first, second and third layers A1, A2 and A3 which are made to grow in this order. The details of the layers are described as follows: In the first layer A1, 10 atomic layers of GaInP (the thickness: 28.3 Å) and 10 atomic layers of AlInP form a pair, and 5 periods are made to one period of the first layer A1. In the same manner, in the second layer A2, 6 atomic layers (the thickness: 17 Å) and 6 atomic layers form a pair, and 7 periods are made to one period of the second layer A2. In the third layer A3, 4 atomic layers (the thickness: 11.3 Å) and 4 atomic layers form a pair, and 9 periods are made to one period of the third layer A3.

On this multiquantum barrier 7, the p-type AlInP: Be cladding layer 8 is laminated by 0.6 μm, the p-type GaInP:Be cap layer 9 is laminated by 1 μm, and the p-type GaAs contact layer 10 is laminated by 0.15 μm.

Figure 1:
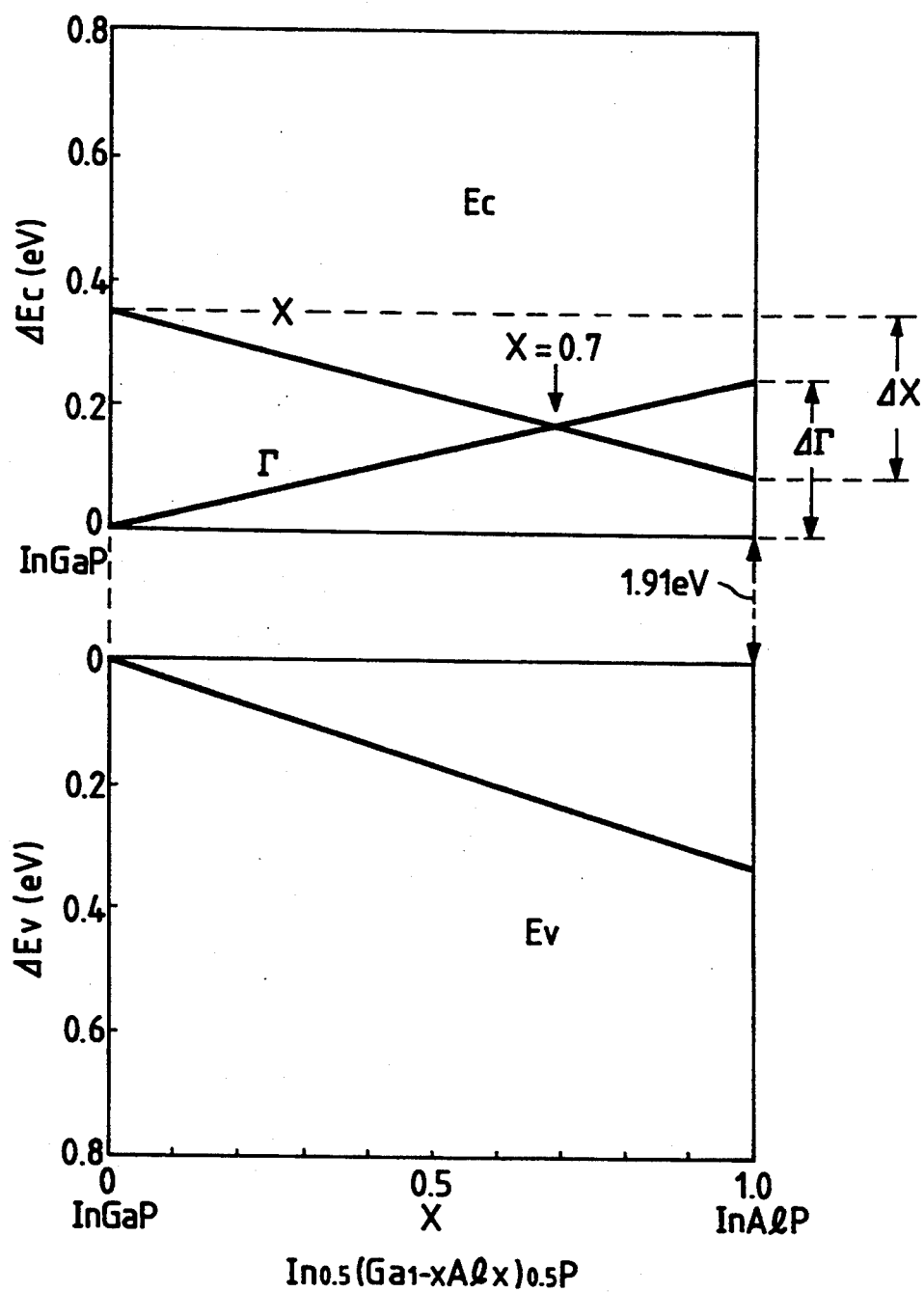
FIG. 1 is an energy band diagram of material of $(Al_xGa_{1-x})_{0.5}In_{0.3}P$.
Figure 2A:
FIGS. 2(a) to 2(d) are graphs showing the reflectivity of electrons at the point X when the electrons are reflected on the multiquantum barrier of GaInP/AlInP.
Figure 2B:
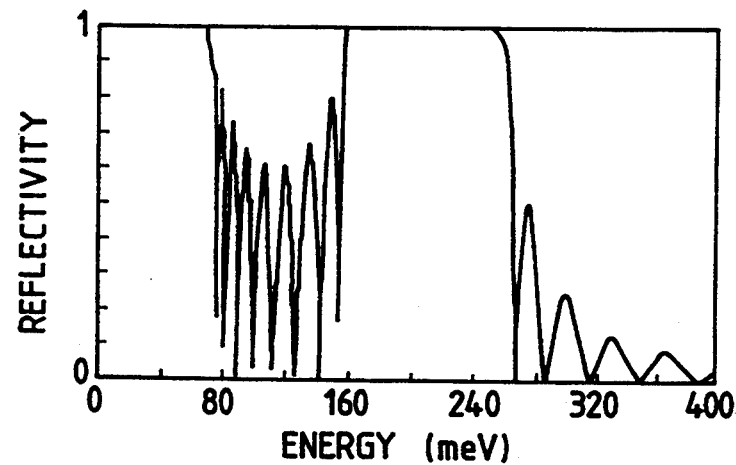
Figure 2C:
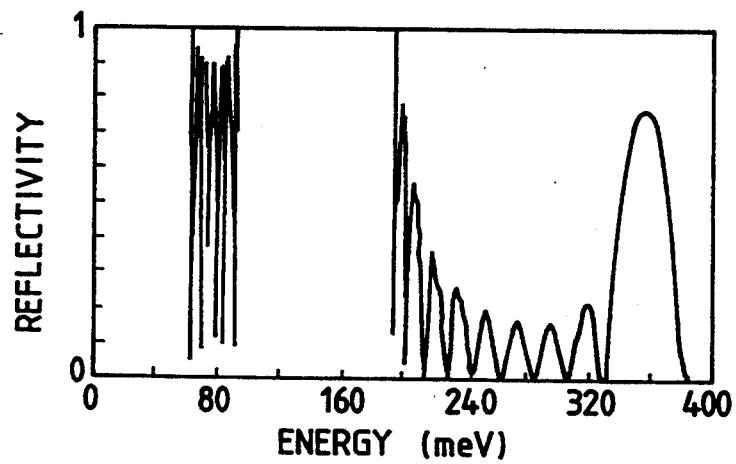
Figure 2D:
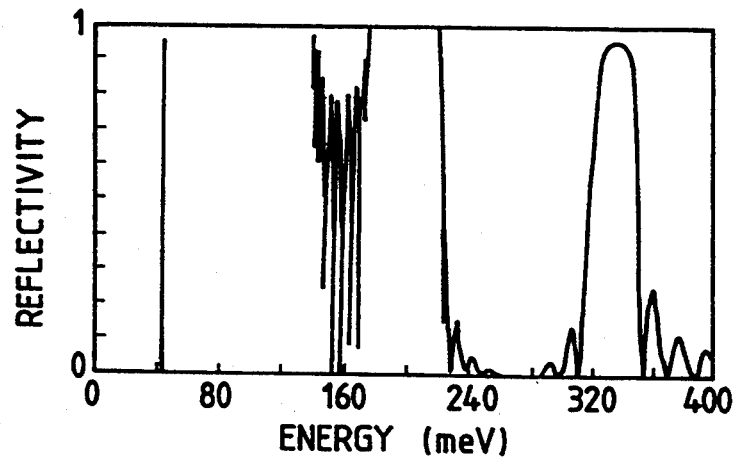
Figure 3A:
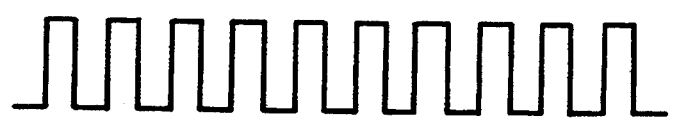
FIGS. 3(a) to 3(d) are graphs showing the reflectivity of electrons at the point Γ when the electrons are reflected on the multiquantum barrier of GaInP/AlInP.
Figure 3B:
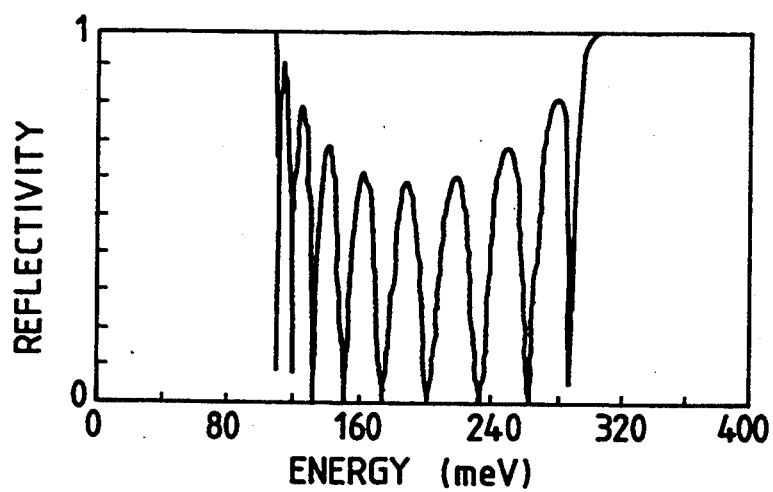
Figure 3C:
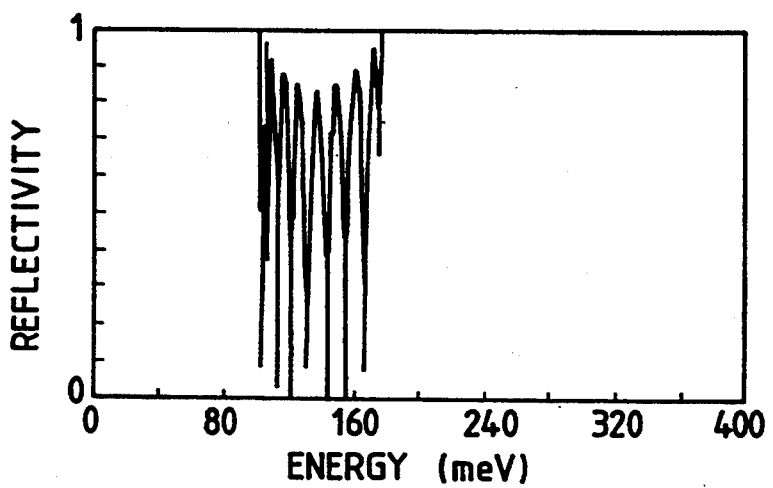
Figure 3D:
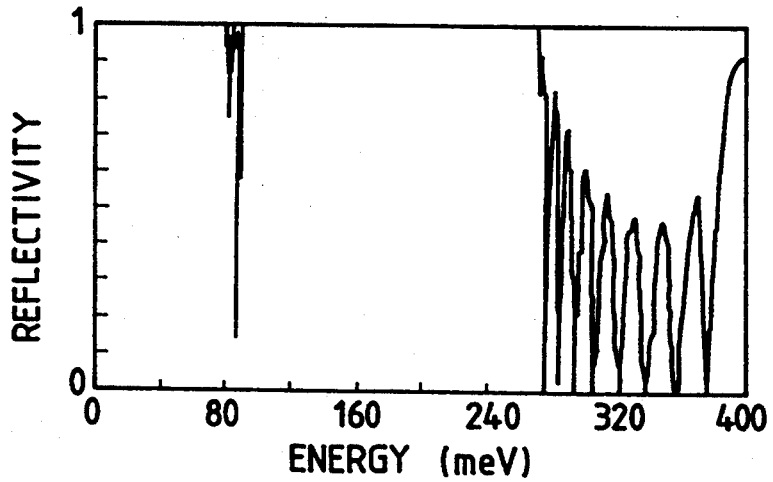
Figure 4A:
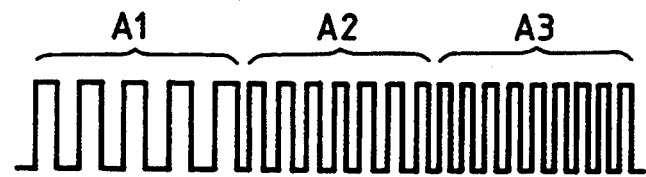
FIGS. 4(a) to 4(c) are graphs showing the reflectivity of electrons on the multiquantum barrier composed of different types of well and barrier layers.
Figure 4B:
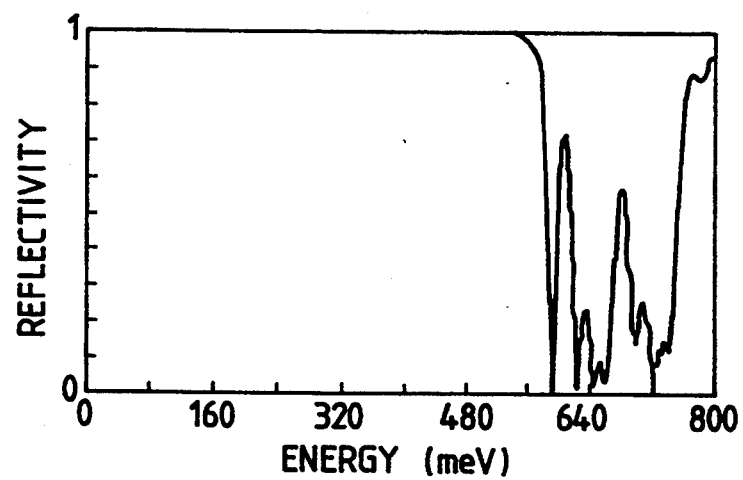
Figure 4C:
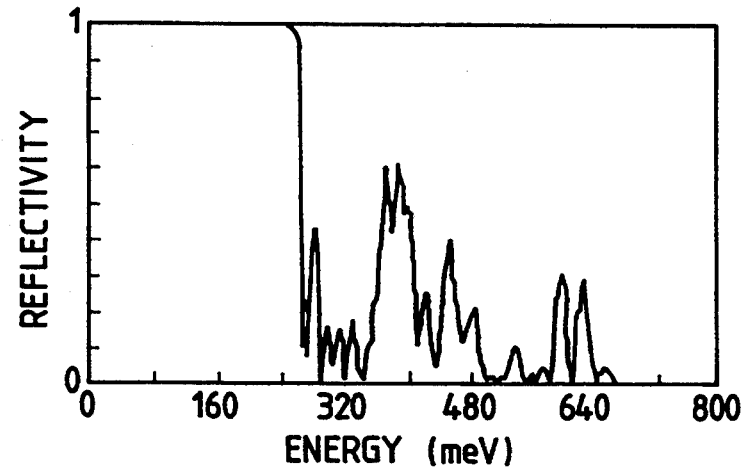
Figure 5A:
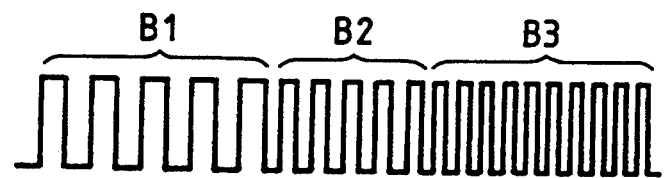
FIGS. 5(a) to 5(c) are graphs showing the reflectivity of electrons on the multiquantum barrier composed of another different type of well and barrier layers.
Figure 5B:
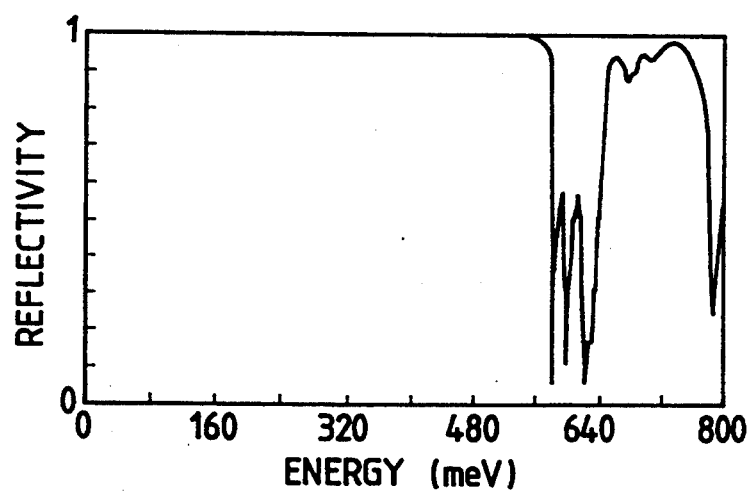
Figure 5C:
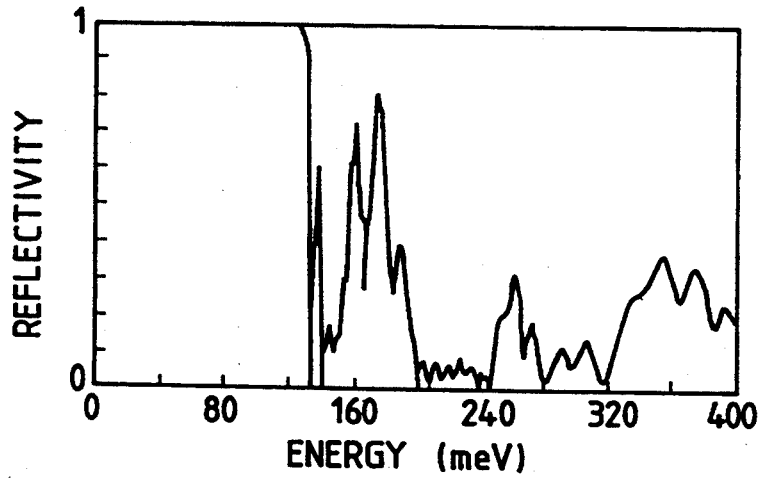

This Embodiment 1 corresponds to the aforementioned structure shown in FIG. 4(a). As can be seen in FIGS. 4(b) and 4(c), a sufficient reflection effect can be provided by this structure even in the case of high energy.

EMBODIMENT 2

Figure 7:
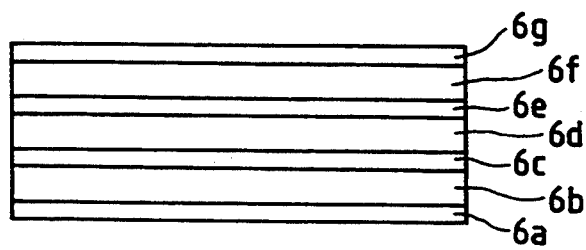
FIG. 7 is a sectional view showing a model of another example of the semiconductor laser unit of the present invention.

In Embodiment 2, the active layer 6 in Embodiment 1 is replaced with a quantum well active layer. As shown in FIG. 7, the active layer is constructed in such a manner that each of the three layers 6b, 6d, 6f of GaInP, the thickness of which is 100 Å, is interposed between the short-period superlattice barriers 6a, 6c, 6e, 6g, the thickness of which is 50 Å. That is, the active layer has a quantum well structure in which the following are laminated in order: superlattice barrier of 50 Å thickness; quantum well of 100 Å thickness; superlattice barrier of 50 Å thickness; quantum well of 100 Å thickness; superlattice barrier of 50 Å thickness; quantum well of 100 Å thickness; and superlattice barrier of 50 Å thickness. Each of the short-period superlattice barriers 6a, 6c, 6e, 6g is composed of a layer of GaInP of 5.6 Å thickness and a layer of AlInP of 5.6 Å thickness.

As described above, when the active layer shown in Embodiment 2 is made to be a quantum well active layer, quantum size effects can be provided, so that the threshold is reduced, the current density is lowered, the efficiency is improved, and the wavelength is shortened.

This embodiment is one of the examples of the laser having vertical structure. This structure can be applied to semiconductor lasers having various lateral structure.

In this embodiment, laser crystals made of AlGaIn material are used. Of course, the present invention can be applied to all compound semiconductor materials made of AlGaAs, GaInAs and the like.

Next, a specific example will be explained, in which the aforementioned multiquantum barrier structure (MQB) is applied to laser structure. This laser structure is a single quantum well structure (SQW) in which a superlattice cladding layer is used for a wave guide layer. A method for manufacturing the multiquantum barrier structure will be described as follows.

First, a Si dope n-type GaAs (referred to as GaAs:Si hereinafter) buffer layer of 0.2 μm thickness, n-type GaInP:Si buffer layer of 0.2 μm thickness, and n-type AlInP:Si cladding layer of 0.6 μm thickness are successively laminated on a substrate of Si dope n-type (100) GaAs. Next, a superlattice cladding layer composed of a non-dope GaInP well layer of 8.4 Å thickness and an AlInP barrier layer of 5.6 Å thickness, is permitted to grow to the thickness of about 800 Å. A non-dope GaInP layer, which is a quantum well active layer, is permitted to grow on this layer to the thickness of 100 Å. In the same manner, a non-dope GaInP well layer of 8.4 Å thickness and a superlattice cladding layer composed of GaInP well layer of 8.4 Å thickness and an AlInP barrier layer of 5.6 Å thickness are permitted to grow to the thickness of about 800 Å.

Next, a multiquantum barrier subjected to p-type doping is permitted to grow, the thickness of which is approximately 830 Å. The barrier structure will be described as follows:

A layer of 5 periods of 10-atomic layer (28.3 Å) GaInP/10-atomic layer AlInP, a layer of 7 periods of 6-atomic layer (17 Å) GaInP/6-atomic layer AlInP, and a layer of 9 periods of 4-atomic layer (11.3 Å) GaInP/4-atomic layer AlInP, are successively permitted to grow in this order. On these laminated layers, a p-type AlInP:Be cladding layer of 0.6 μm thickness, a p-type cap layer GaInP: Be of 0.1 μm thickness, and p-type GaAs contact layer of 0.15 μm thickness are laminated.

In order to make a comparison, both quantum well laser crystals to which the multiquantum barrier structure proposed by Takagi et al. was assembled (shown in "Design of multiquantum barrier (MQB) and experimental verification of reflecting effect of electronic waves" by Takagi and et al. on page 527 to 535 of Vol. J74-C-I of theses of C-I of Electronic Information Communication Society published in December of 1991), and conventional quantum well laser crystals having no multiquantum barrier were manufactured. The multiquantum barrier structure proposed by Takagi and et al. includes the first barrier layer of 200 Å, and 10 periods of 17Å-GaInP/14.3Å-AlInP are provided. All structure was the same except for the multiquantum barrier.

Figure 8:
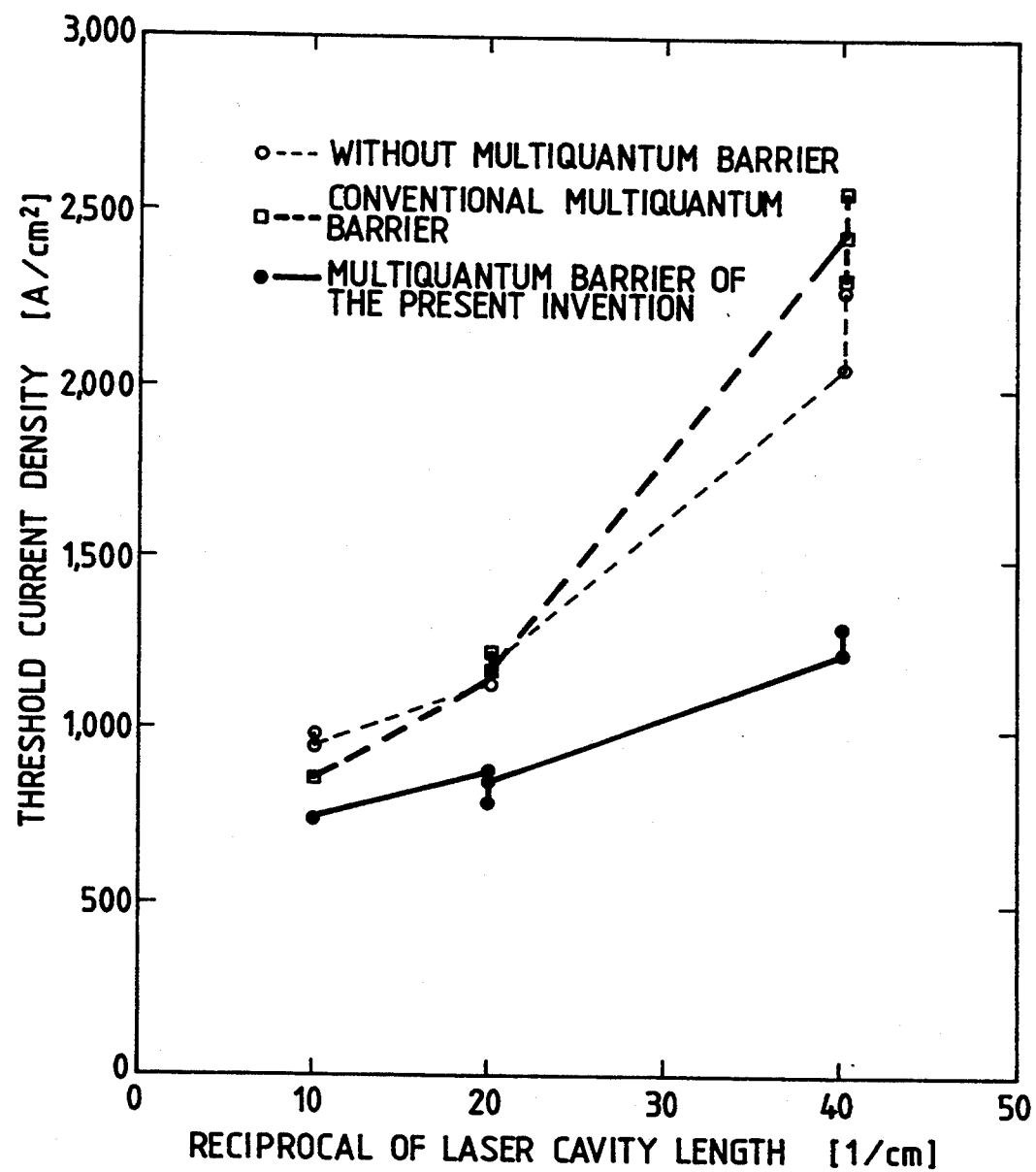
FIG. 8 is a graph showing a relation between the threshold current density and the reciprocal of cavity length.

The laser crystals manufactured in the manner described above were evaluated through the broad area test. Width of the pulse current was 250 ns, and the duty ratio was 1/3200. Oscillating wavelength was 664±5 nm. First, a relation between the threshold current density ($J_{th}$) and the reciprocal (1/Lc) of the length of a cavity is shown in FIG. 8. In the drawing, a dotted line represents the characteristics of a single quantum well laser crystal without the multiquantum barrier. A broken line represents the characteristics of a single quantum well laser crystal in which the conventional multiquantum barrier is provided. A solid line represents the characteristics of a single quantum well laser crystal to which the multiquantum barrier of the present invention is assembled. In the case where the cavity length is 1 mm (1/Lc=10 cm$^{-1}$), the threshold current density $J_{th}$ of the conventional single quantum well (SQW) laser was approximately 1000 Å/cm$^2$. On the other hand, the threshold current density $J_{th}$ of the laser to which the multiquantum barrier structure of the present invention was introduced, was very low, that is, the threshold current density $J_{th}$ was 750 Å/cm². Even when the cavity length was 500 μm, an average of the threshold current density $J_{th}$ was very low, that is, the average of the threshold current density $J_{th}$ was 840 Å/cm2. Even when the cavity length was reduced to 250 mm, an increment of the threshold current density $J_{th}$ was small compared with the threshold current density $J_{th}$ of other lasers.

On the other hand, in the case where the cavity was long, the threshold current density $J_{th}$ of the laser having the conventional multiquantum barrier was relatively low, that is, the threshold current density $J_{th}$ was 870 Å/cm². However, when the cavity length was reduced, the threshold current density $J_{th}$ was greatly increased. Therefore, this laser was approximately the same as the laser having no multiquantum barrier structure. In general, when the cavity length is reduced, a gain necessary for laser oscillation is increased, so that the density of electrons to be injected is increased. As the electron density is increased, electron overflow tends to occur. In the conventional multiquantum barrier structure in which the overflow of electrons is not suppressed at the point X, electrons easily overflow through the point X, the reflectivity of which is low. The graph shown in FIG. 8 reflects the facts described above.

Figure 9:
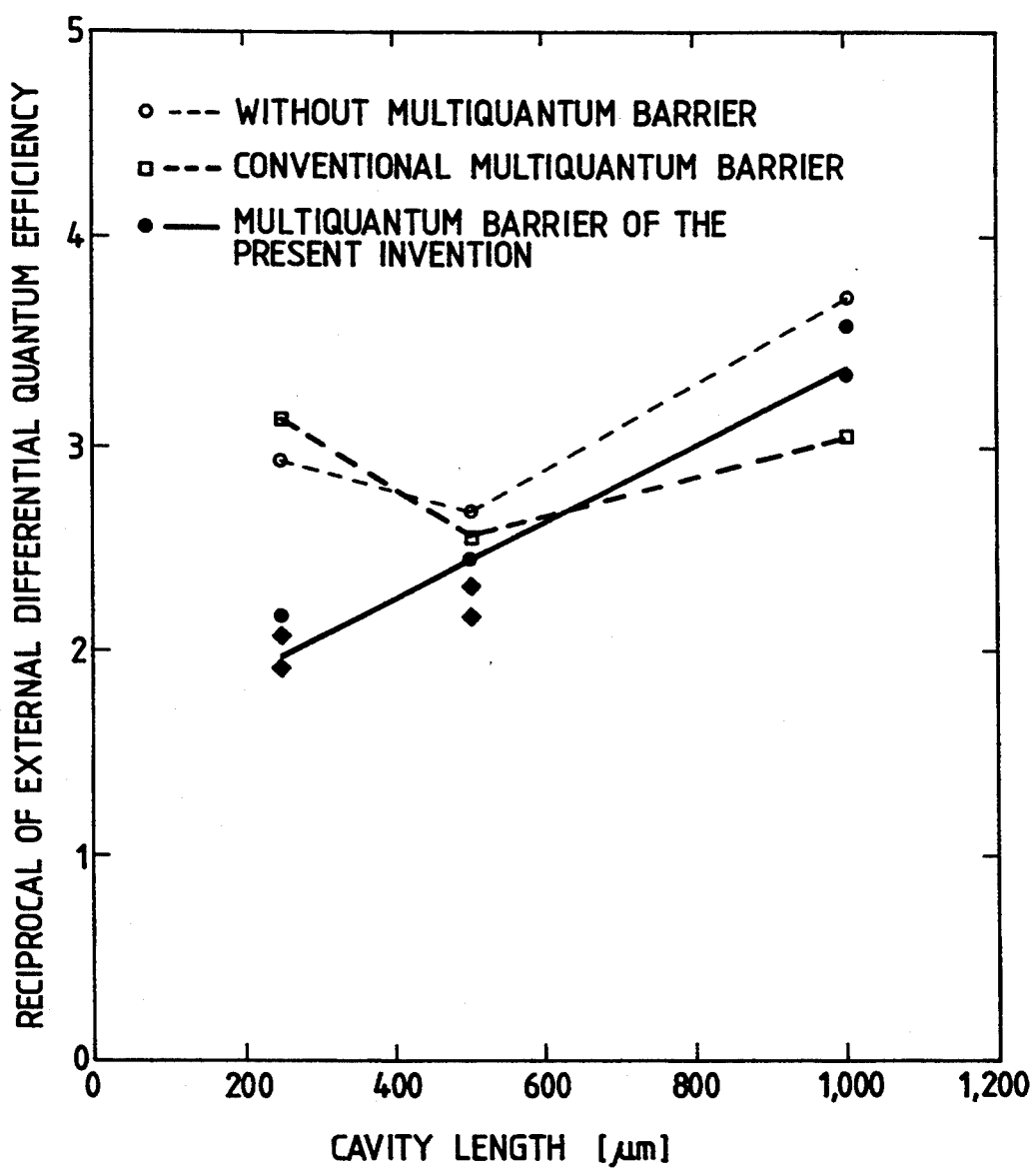
FIG. 9 is a graph showing a relation between the reciprocal of external differential quantum efficiency and the cavity length.
Figure 10:
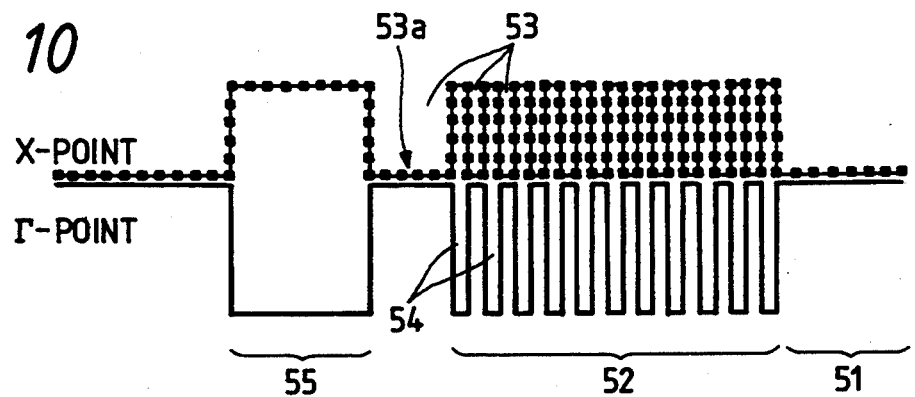
FIG. 10 is a schematic illustration showing the band structure at the points Γ and X in a semiconductor laser having the conventional multiquantum barrier composed of the GaInP well layer and $(Al_{0.7}Ga_{0.3})_{0.5}In_{0.5}P$ barrier layer.
Figure 11:
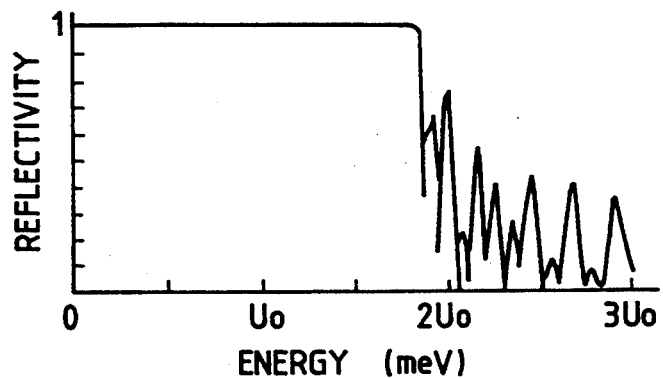
FIG. 11 is a graph showing the reflectivity of electrons at the point Γ on the conventional multiquantum barrier.
Figure 12:
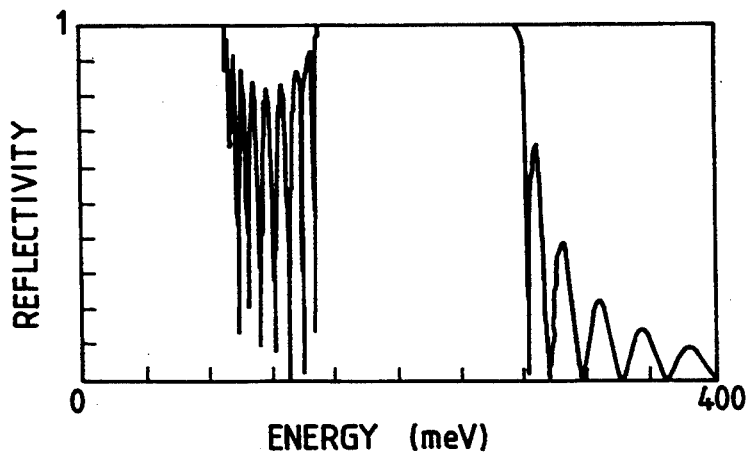
FIG. 12 is a graph showing the reflectivity of electrons at the point X on the conventional multiquantum barrier.

Next, a relation between the reciprocal of external differential quantum efficiency and the cavity length is shown in FIG. 9. In the drawing, a dotted line represents the characteristics of a single quantum well laser crystal without the multiquantum barrier. A broken line represents the characteristics of a single quantum well laser crystal in which the conventional multiquantum barrier is provided. A solid line represents the characteristics of a single quantum well laser crystal to which the multiquantum barrier of the present invention is assembled. External quantum efficiency of the laser having the multiquantum barrier structure of the present invention is approximately monotonously increased to about 50% at the maximum when the cavity length is shortened. That is, desirable laser characteristics can be provided. On the other hand, in the laser having the conventional multiquantum barrier structure, the efficiency is greatly lowered when the cavity length is reduced to a value not more than 500 μm, so that the efficiency is approximately the same as that of a laser having no multiquantum barrier. As described before, the reason why the efficiency is low is that the overflow of electrons is not suppressed.

As described before, it can be seen from the result of evaluation of the laser characteristics that the overflow of electrons is suppressed in the laser crystals to which the multiquantum barrier structure of the present invention is assembled.

According to the present invention, the following effects can be provided.

(1) Whereas the overflow of electrons and holes is suppressed, the semiconductor laser can be manufactured, in which the threshold current density is low so that the efficiency is high and desirable temperature characteristics can be provided.

(2) Whereas the overflow of electrons and holes is suppressed, an amount of carrier to be injected is increased, so that the characteristics of high output semiconductor laser can be improved.

(3) Whereas the effective band gap of the cladding layer is extended, the overflow of electrons and holes from the active layer to the cladding layer seldom occurs. Therefore, a semiconductor laser to provide beams of light of orange to yellow, the wavelength of which shorter than that of red, can be manufactured.

(4) In the case where the multiquantum barrier is provided on the GaAs substrate side, the multiquantum barrier of superlattice functions as a buffer layer to improve the crystal quality of a growing layer. Accordingly, the laser characteristics can be improved.

What is claimed is:

1. A semiconductor laser unit having an active layer and cladding layers, wherein said active layer is interposed between said cladding layers, comprising:
   a multiquantum barrier layer including well layers and barrier layers disposed in one or both of said cladding layers, or disposed in one or both of said cladding layers close to said active layer, wherein
   said well and barrier layers include at least one first pair of a well layer and a barrier layer and at least one second pair of a well layer and a barrier layer, said first pair of well and barrier layers having different characteristics from said second pair of well and barrier layers to provide relatively high reflectivities with respect to electrons and/or holes at a position close to a Γ-point in a reciprocal lattice space and at a position close to any one of primary symmetrical points.

2. The semiconductor laser unit according to claim 1, wherein said multiquantum barrier layer is composed of laminated multiquantum barrier layers of different characteristics.

3. The semiconductor laser unit according to claim 1, wherein said multiquantum barrier layer is made of AlGaInP system material.

4. The semiconductor laser unit according to claim 3, wherein said multiquantum barrier layer is composed of the lamination of a pair of GaInP well layer and AlInP barrier layer.

5. The semiconductor laser unit according to claim 4, wherein said multiquantum barrier layer is composed of a first, a second and a third laminated layers, and wherein 10 atomic well and barrier layers are alternately laminated in said first layer, 6 atomic well and barrier layers are alternately laminated in said second layer, and 4 atomic well and barrier layers are alternately laminated in said third layer.

6. The semiconductor laser unit according to claim 4, wherein said multiquantum barrier layer is composed of a first, a second and a third laminated layers, and wherein well and barrier layers, the thickness of which is respectively 25 to 35 Å, are alternately laminated in said first layer, well and barrier layers, the thickness of which is respectively 15 to 25 Å, are alternately laminated in said second layer, and well and barrier layers, the thickness of which is respectively 10 to 15 Å, are alternately laminated in said third layer.

7. A semiconductor laser unit, comprising:
   an active layer;
   cladding layers between which said active layer is interposed; and
   a multiquantum barrier layer disposed between said active layer and one of said cladding layers, or disposed in one or both of said cladding layers close to said active layer, wherein
   said multiquantum barrier layer includes at least one first pair of a well layer and a barrier layer and at least one second pair of a well layer and a barrier layer, said first pair of well and barrier layers having different characteristics from said second pair of well and barrier layers to provide relatively high reflectivities with respect to electrons and/or holes at a plurality of primary symmetrical points in a reciprocal lattice space, or at respective positions close to the plurality of primary symmetrical points.

8. The semiconductor laser unit according to claim 7, wherein said multiquantum barrier layer is composed of laminated multiquantum barrier layers of different characteristics.

9. The semiconductor laser unit according to claim 7, wherein said multiquantum barrier layer is made of AlGaInP system material.

10. The semiconductor laser unit according to claim 9, wherein said multiquantum barrier layer is composed of the lamination of a pair of GaInP well layer and AlInP barrier layer.

11. The semiconductor laser unit according to claim 10, wherein said multiquantum barrier layer is composed of a first, a second and a third laminated layers, and wherein 10 atomic well and barrier layers are alternately laminated in said first layer, 6 atomic well and barrier layers are alternately laminated in said second layer, and 4 atomic well and barrier layers are alternately laminated in said third layer.

12. The semiconductor laser unit according to claim 10, wherein said multiquantum barrier layer is composed of a first, a second and a third laminated layers, and wherein well and barrier layers, the thickness of which is respectively 25 to 35 Å, are alternately laminated in said first layer, well and barrier layers, the thickness of which is respectively 15 to 25 Å, are alternately laminated in said second layer, and well and barrier layers, the thickness of which is respectively 10 to 15 Å, are alternately laminated in said third layer.

13. A semiconductor laser unit, comprising:
an active layer;
cladding layers between which said active layer is interposed; and
a multiquantum barrier disposed between said active layer and one of said cladding layers, or disposed in one or both of said cladding layers close to said active layer, wherein
said multiquantum barrier layer includes at least one first pair of a well layer and a barrier layer and at least one second pair of a well layer and a barrier layer, said first pair of well and barrier layers having different characteristics from said second pair of well and barrier layers to provide relatively high reflectivities with respect to electrons and/or holes at a Γ-point in a reciprocal lattice space or at a position close to said Γ-point in the reciprocal lattice space and at at least one of primary symmetrical points in the reciprocal lattice space except said Γ-point, or at a point close to the primary symmetrical point.

14. The semiconductor laser unit according to claim 13, wherein said multiquantum barrier layer is composed of laminated multiquantum barrier layers of different characteristics.

15. The semiconductor laser unit according to claim 13, wherein said multiquantum barrier layer is made of AlGaInP system material.

16. The semiconductor laser unit according to claim 15, wherein said multiquantum barrier layer is composed of the lamination of a pair of GaInP well layer and AlInP barrier layer.

17. The semiconductor laser unit according to claim 16, wherein said multiquantum barrier layer is composed of the first, second and third laminated layers, and wherein 10 atomic well and barrier layers are alternately laminated in said first layer, 6 atomic well and barrier layers are alternately laminated in said second layer, and 4 atomic well and barrier layers are alternately laminated in said third layer.

18. The semiconductor laser unit according to claim 16, wherein said multiquantum barrier layer is composed of the first, second and third laminated layers, and wherein well and barrier layers, the thickness of which is respectively 25 to 35 Å, are alternately laminated in said first layer, well and barrier layers, the thickness of which is respectively 15 to 25 Å, are alternately laminated in said second layer, and well and barrier layers, the thickness of which is respectively 10 to 15 Å, are alternately laminated in said third layer.

19. A semiconductor laser unit having an active layer and cladding layers, wherein said active layer is interposed between said cladding layers, comprising:
laminated multiquantum barrier layers of different characteristics and of the AlGaInP material system and including a lamination of a pair of a GaInP well layer and an AlInP barrier layer, said laminated multiquantum barrier layers including well layers and barrier layers disposed between said active layer and one of said cladding layers, or disposed in one or both of said cladding layers close to said active layer, wherein
said well and barrier layers have relatively high reflectivities with respect to electrons and/or holes at a position close to a Γ-point in a reciprocal lattice space, and said well and barrier layers have a high reflectivity with respect to the electrons and holes at a position close to at least one of the primary symmetrical points.

20. The semiconductor laser unit according to claim 19, wherein one said laminated multiquantum barrier layer is composed of first, second, and third laminated layers, and wherein 10 atomic well and barrier layers are alternately laminated in said first layer, 6 atomic well and barrier layers are alternately laminated in said second layer, and 4 atomic well and barrier layers are alternately laminated in said third layer.

21. The semiconductor laser unit according to claim 19, wherein one said laminated multiquantum barrier layer is composed of first, second, and third laminated layers, and wherein well and barrier layers, the thickness of which is respectively 25 to 35 Å, are alternately laminated in said first layer, well and barrier layers, the thickness of which is respectively 15 to 25 Å, are alternately laminated in said second layer, and well and barrier layers, the thickness of which is respectively 10 to 15 Å, are alternately laminated in said third layer.

22. A semiconductor laser unit, comprising:
an active layer;
cladding layers between which said active layer is interposed; and
laminated multiquantum barrier layers of different characteristics and of the AlGaInP material system and including a lamination of a pair of a GaInP well layer and an AlInP barrier layer, said laminated multiquantum barrier layers disposed between said active layer and one of said cladding layers, or disposed in one or both of said cladding layers close to said active layer, wherein said laminated multiquantum barrier layers have relatively high reflectivities with respect to electrons and/or holes at a plurality of primary symmetrical points in a reciprocal lattice space, or at respective positions close to the plurality of primary symmetrical points.

23. The semiconductor laser unit according to claim 22, wherein one said multiquantum barrier layer is composed of first, second, and third laminated layers, and wherein 10 atomic well and barrier layers are alternately laminated in said first layer, 6 atomic well and barrier layers are alternately laminated in said second layer, and 4 atomic well and barrier layers are alternately laminated in said third layer.

24. The semiconductor laser unit according to claim 22, wherein one said multiquantum barrier layer is composed of first, second, and third laminated layers, and wherein well and barrier layers, the thickness of which is respectively 25 to 35 Å, are alternately laminated in said first layer, well and barrier layers, the thickness of which is respectively 15 to 25 Å, are alternately laminated in said second layer, and well and barrier layers, the thickness of which is respectively 10 to 15 Å, are alternately laminated in said third layer.

25. A semiconductor laser unit, comprising:
an active layer;
cladding layers between which said active layer is interposed; and
laminated multiquantum barrier layers of different characteristics and of the AlGaInP material system and including a lamination of a pair of a GaInP well layer and an AlInP barrier layer, said laminated multiquantum barrier layers disposed between said active layer and one of said cladding layers, or disposed in one or both of said cladding layers close to said active layer, wherein
said laminated multiquantum barrier layers having relatively high reflectivities with respect to electrons and/or holes at a $\Gamma$-point in a reciprocal lattice space or at a position close to said $\Gamma$-point in the reciprocal lattice space and at at least one of primary symmetrical points in the reciprocal lattice space except said $\Gamma$-point, or at a point close to the primary symmetrical point.

26. The semiconductor laser unit according to claim 25, wherein one said multiquantum barrier layer is composed of first, second, and third laminated layers, and wherein 10 atomic well and barrier layers are alternately laminated in said first layer, 6 atomic well and barrier layers are alternately laminated in said second layer, and 4 atomic well and barrier layers are alternately laminated in said third layer.

27. The semiconductor laser unit according to claim 25, wherein one said multiquantum barrier layer is composed of first, second, and third laminated layers, and wherein well and barrier layers, the thickness of which is respectively 25 to 35 Å, are alternately laminated in said first layer, well and barrier layers, the thickness of which is respectively 15 to 25 Å, are alternately laminated in said second layer, and well and barrier layers, the thickness of which is respectively 10 to 15 Å, are alternately laminated in said third layer.

* * * * *